(12) United States Patent
Yamada

(10) Patent No.: US 7,340,701 B2
(45) Date of Patent: Mar. 4, 2008

(54) LAYOUT VERIFICATION METHOD AND DEVICE

(75) Inventor: Tomoyuki Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 284 days.

(21) Appl. No.: 11/224,129

(22) Filed: Sep. 13, 2005

(65) Prior Publication Data
US 2006/0064657 A1 Mar. 23, 2006

(30) Foreign Application Priority Data
Sep. 17, 2004 (JP) ............................. 2004-271617

(51) Int. Cl.
*G06F 17/50* (2006.01)
(52) U.S. Cl. .................. 716/4; 716/1; 716/5
(58) Field of Classification Search ............ 716/4, 716/5, 11, 1
See application file for complete search history.

(56) References Cited

U.S. PATENT DOCUMENTS 6,713,817 B2 * 3/2004 Kitagawa et al. ........... 257/360
2002/0063296 A1 * 5/2002 Kitagawa et al. ........... 257/369
2002/0083405 A1 * 6/2002 Ishikura .......................... 716/7
2002/0192886 A1 * 12/2002 Inoue .......................... 438/197

FOREIGN PATENT DOCUMENTS

JP 2001-282884 10/2001

* cited by examiner

*Primary Examiner*—Sun James Lin
(74) *Attorney, Agent, or Firm*—Staas & Halsey LLP

(57) ABSTRACT

There is provided a layout verification method including a space acquisition step of, with a wiring connected to a gate through a via as a target wiring, acquiring a space between the target wiring and a wiring adjacent thereto, a calculation step of calculating an antenna ratio according to the space between the target wiring and the adjacent wiring, the area of the gate, and the area of the target wiring, and an output step of outputting an antenna damage error when the antenna ratio exceeds a predetermined value.

15 Claims, 6 Drawing Sheets

807

901
807

902  902
807

LAYOUT VERIFICATION METHOD AND DEVICE

CROSS-REFERENCE TO RELATED APPLICATIONS

This application is based upon and claims the benefit of priority from the prior Japanese Patent Application No. 2004-271617, filed on Sep. 17, 2004, the entire contents of which are incorporated herein by reference.

BACKGROUND OF THE INVENTION

1. Field of the Invention

The present invention relates to layout verification, and particularly relates to layout verification to prevent antenna damage.

2. Description of the Related Art

A metal wiring connected to a gate of a transistor is fabricated by plasma etching. When the metal wiring is plasma-etched, charge occurs, and the charge is stored in the gate of the transistor connected to the metal wiring. As a result, a phenomenon in which a gate oxide film is destroyed and transistor characteristics deteriorate occurs. This phenomenon is called antenna damage because the metal wiring functions as an antenna which accumulates the charge.

As one method to prevent this antenna damage, a reduction in the area of the metal wiring is useful. At a design stage, in order to prevent the antenna damage from occurring, layout verification to prevent the antenna damage is performed. A layout verification method to prevent antenna damage is shown in FIG. 10 of the following Patent Document 1.

(Patent Document 1)
Japanese Patent Application Laid-open No. 2001-282884

SUMMARY OF THE INVENTION

An object of the present invention is to effectively perform layout verification to prevent antenna damage to thereby realize an efficient layout and downsize a semiconductor device.

According to one aspect of the present invention, there is provided a layout verification method including: a space acquisition step of, with a wiring connected to a gate through a via as a target wiring, acquiring a space between the target wiring and a wiring adjacent thereto; a calculation step of calculating an antenna ratio according to the space between the target wiring and the adjacent wiring, an area of the gate, and an area of the target wiring; and an output step of outputting an antenna damage error when the antenna ratio exceeds a predetermined value.

DETAILED DESCRIPTION OF THE PREFERRED EMBODIMENTS

First Embodiment

Figure 8A:
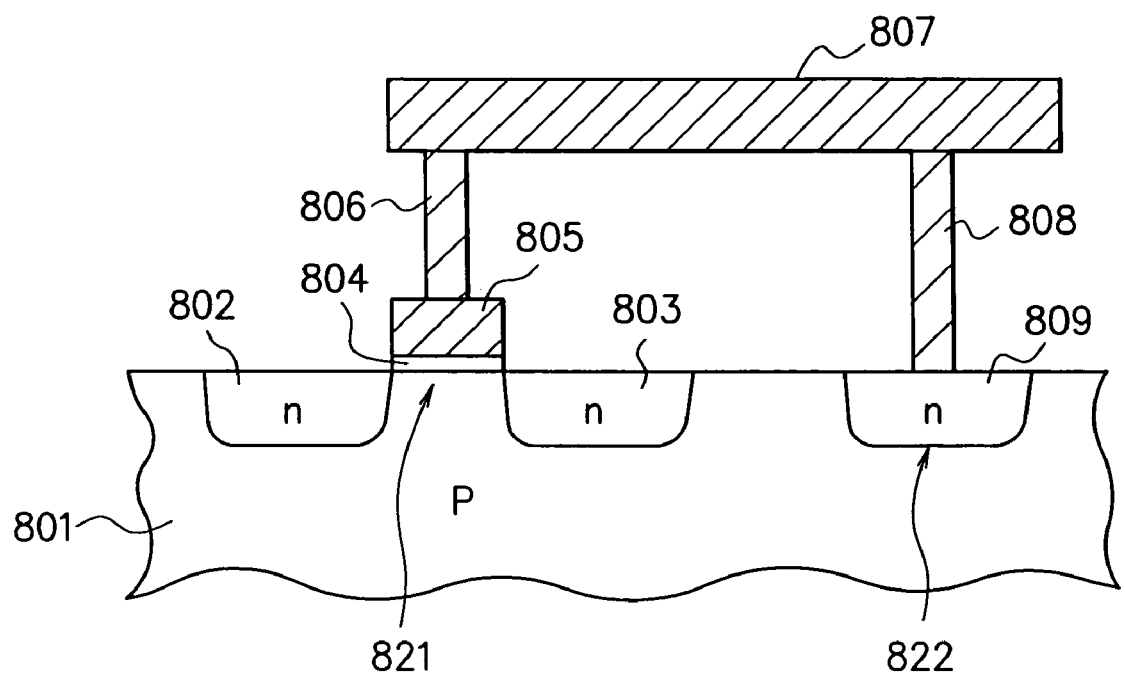
FIG. 8A is a sectional view of a semiconductor device to be subjected to layout verification.
Figure 8B:
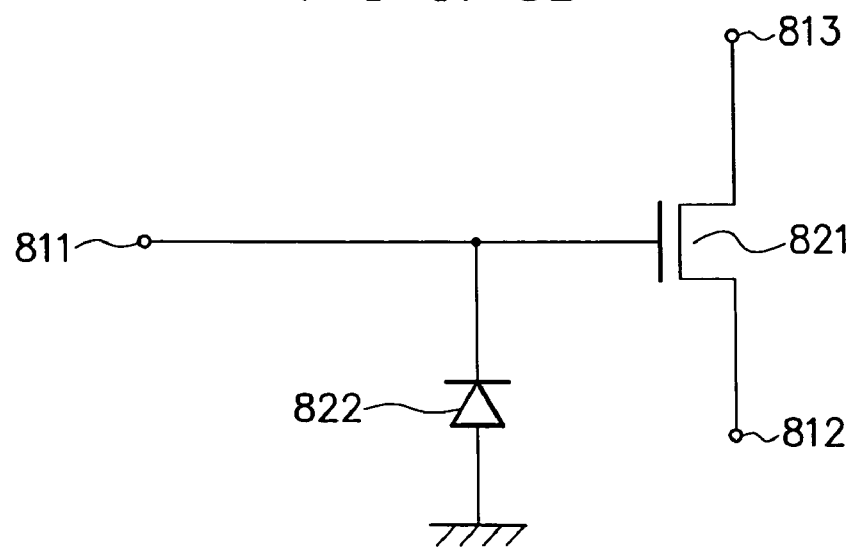
FIG. 8B is an equivalent circuit diagram thereof.

FIG. 8A is a sectional view of a semiconductor device to be subjected to layout verification in the first embodiment of the present invention, and FIG. 8B is an equivalent circuit diagram thereof. At the surface of a p-type region 801 of a semiconductor substrate, n-type regions 802 and 803, and 809 are provided. The n-type regions 802 and 803 are respectively a source and a drain and connected to a source terminal 812 and a drain terminal 813. A channel region is formed between the n-type regions 802 and 803. A gate oxide film 804 is formed on the channel region. A gate 805 is formed on the gate oxide film 804. These gate 805, source 802 and drain 803 constitute an n-channel MOS field effect transistor 821. A metal wiring 807 is connected to the gate 805 through a via 806. A gate terminal 811 is connected to the gate 805 through the metal wiring 807 and the via 806. The n-type region 809 is connected to the metal wiring 807 through a via 808. The p-type region 801 and the n-type region 809 constitute a diode 822. The p-type region 801 is connected to a ground.

Plasma etching is used for forming a pattern of the metal wiring 807. The metal wiring 807 is connected to the gate 805 and insulated from the semiconductor substrate by the gate oxide film 804, whereby plasma charge gathers in the metal wiring 807. Thereby, a high voltage is applied to the gate oxide film 804 of the transistor 821. This phenomenon causes destruction of the gate oxide film 804 and deterioration of transistor characteristics. This is antenna damage.

To prevent this antenna damage, the diode 822 is provided. If not less than a predetermined amount of plasma charge is stored in the gate 805, a backward current flows to the diode 822, and the plasma charge is discharged to the ground. However, even if the diode 822 is provided, the antenna damage occurs when the area of the metal wiring 807 is too large or the area of the diode 822 is too small.

Moreover, to prevent the antenna damage at the manufacturing stage of the semiconductor device from occurring, whether the antenna damage occurs or not is verified by layout verification in a design stage. More specifically, the following antenna ratio is calculated, and when the antenna ratio exceeds a predetermined value, it is judged that the antenna damage occurs and an antenna damage error is outputted.

For example, when the area of the metal wiring 807 is taken as B1, the area of the protective element (diode) 822 connected to the metal wiring 807 is taken as B2, and the area of the gate 805 is taken as B3, the antenna ratio is calculated by (B1−B2)/B3. The antenna ratio becomes larger as the area B1 of the metal wiring 807 becomes larger, and becomes smaller as the area B3 of the gate 805 becomes larger.

When the antenna damage error is outputted as a result of the verification, a layout design is changed so that the antenna ratio becomes smaller. For example, the area of the metal wiring 807 is reduced, or the area of the diode 822 is increased. The increase in the area of the diode 822 is effective in preventing the antenna damage, but it has the disadvantage that the area of the entire semiconductor device increases.

Here, it is empirically known that in the actual semiconductor device, the antenna damage is influenced by a space between the metal wiring 807 and a wiring adjacent thereto. A detailed explanation thereof will be given with reference to FIG. 9A to FIG. 9C.

Figure 9A:
FIG. 9A to FIG. 9C are diagrams showing relations between a target wiring and its adjacent wirings in a metal wiring layer.

FIG. 9A is a diagram showing a case where only the target wiring 807 of the metal wiring exists and no wiring adjacent thereto exists in the same layer. In this case, if the antenna ratio is, for example, 2000 or less, the antenna damage does not occur.

Figure 9B:
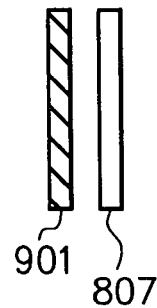

FIG. 9B is a diagram showing a case where on only one side of the target wiring 807 of the metal wiring in the same layer, a wiring 901 adjacent thereto exists. In this case, if the antenna ratio is, for example, 3000 or less, the antenna damage does not occur.

Figure 9C:
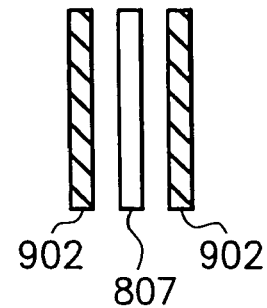

FIG. 9C is a diagram showing a case where on both sides of the target wiring 807 of the metal wiring in the same layer, wirings 902 adjacent thereto exist. In this case, if the antenna ratio is, for example, 5000 or less, the antenna damage does not occur.

When the adjacent wiring exists in the neighborhood of the target wiring as described above, plasma charge flows from the target wiring into the adjacent wiring, and the amount of charge in the target wiring reduces, whereby a tendency for the antenna damage to occur is reduced. As a result, the antenna ratios is FIG. 9A to FIG. 9C have different values it is usually thought that when the layout verification is made, the antenna ratio of 2000 in FIG. 9A which is the most severe condition out of those in FIG. 9A to FIG. 9C is adopted. Whatever the condition of the adjacent wiring is, the antenna damage does not occur as long as the antenna ratio is 2000 or less. Namely, in the layout verification, in the cases of FIG. 9A to FIG. 9C, the values of the antenna ratios become equal, and if the antenna ratio exceeds 2000, the antenna damage error is outputted.

However, in actuality, even if the condition for antenna damage verification is more relaxed in FIG. 9B and FIG. 9C, the antenna damage does not occur. Also in the cases of FIG. 9B and FIG. 9C, the same severe antenna damage verification as in the case of FIG. 9A is performed, whereby the area of the diode 822 is increased more than necessary, which causes a problem that the area of the semiconductor device increases. A method of performing the antenna damage verification according to the space between the target wiring and the adjacent wiring will be explained below.

Figure 1:
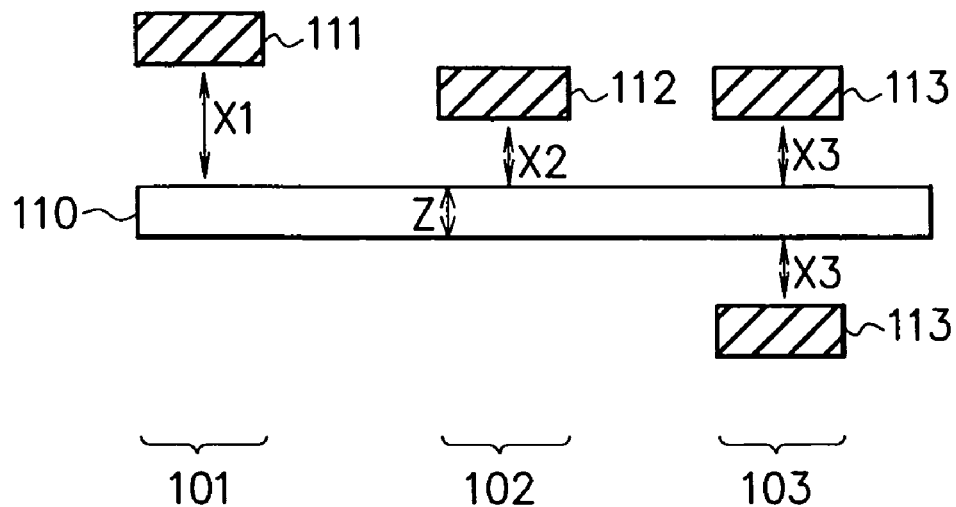
FIG. 1 is a diagram of layout data showing relations between a target wiring and its adjacent wirings in a metal wiring layer according to a first embodiment of the present invention.

FIG. 1 is a diagram of layout data showing relations between a target wiring and its adjacent wirings in a metal wiring layer. A target wiring 110 corresponds to the metal wiring 807 in FIG. 8A, and its width is Z. A region 101 of the target wiring 110 corresponds to FIG. 9A, and a space between the target wiring 110 and a wiring 111 adjacent thereto is X1 which is equal to or more than a threshold value X. A region 102 of the target wiring 110 corresponds to FIG. 9B, and a space between the target wiring 110 and a wiring 112 adjacent on one side thereof is X2 which is less than the threshold value X. A region 103 of the target wiring 110 corresponds to FIG. 9C, and spaces between the target wiring 110 and wirings 113 adjacent on both sides thereof are each X3 which is less than the threshold value X. An example in which the antenna damage verification is performed based on this layout data will be explained.

Figure 2:
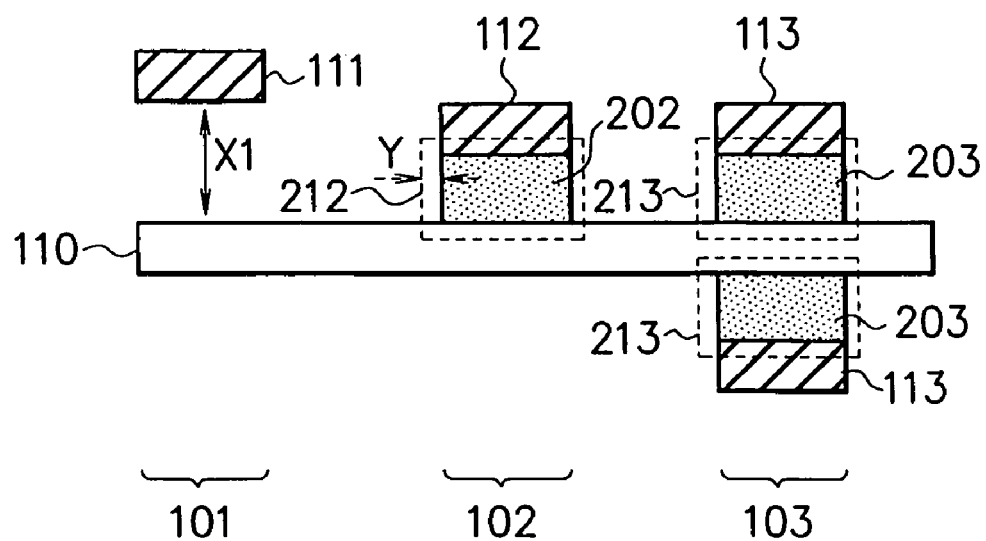
FIG. 2 is s diagram for explaining an antenna damage verification method according to the first embodiment.

FIG. 2 is a diagram for explaining an antenna damage verification method of the layout data in FIG. 1. First, when the spaces between the target wiring 110 and the adjacent wirings 111 to 113 are less than the threshold value X, respective error flags of regions between the target wiring 110 and the adjacent wirings 111 to 113 are set. In the region 101, since the space X1 between the target wiring 110 and the adjacent wiring 111 is equal to or more than the threshold value X, an error flag is not set. In the region 102, since the space X2 between the target wiring 110 and the adjacent wiring 112 is less than the threshold value X, an error flag of a region 202 between the target wiring 110 and the adjacent wiring 112 is set. In the region 103, since the spaces X3 between the target wiring 110 and the adjacent wirings 113 are each less than the threshold value X, error flags of regions 203 between the target wiring 110 and the adjacent wirings 113 are set.

Next, the regions 202 and 203 in which the error flags are set are extended outward by a predetermined value Y. By extending the region 202 by the predetermined value Y, an error flag region 212 is formed. By extending the region 203 by the predetermined value Y, an error flag region 213 is formed.

Figure 3:
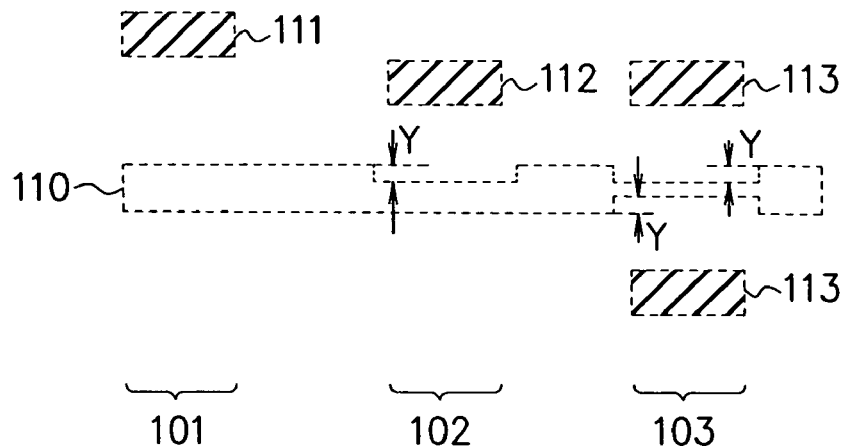
FIG. 3 is a diagram for explaining the antenna damage verification method according to the first embodiment.

FIG. 3 is a diagram, subsequent to FIG. 2, for explaining the antenna damage verification method. Portions of the target wiring 110 in FIG. 2 overlapping with the error flag regions 212 and 213 are subjected to a logical negation (NOT) process of the target wiring 110. Namely, regions of the target wiring 110 overlapping with the error flag regions 212 and 213 are eliminated from the target wiring 110.

More specifically, when only the space X2 between the target wiring 110 and the adjacent wiring 112 on one side thereof is less than the predetermined value X, the wiring width of a portion of the target wiring 110 facing the adjacent wiring 112 is narrowed by the first width Y. When the spaces X3 between the target wiring 110 and the adjacent wirings 113 on both sides thereof are both less than the predetermined value X, the wiring width of a portion of the target wiring 110 facing the adjacent wirings 113 on both sides thereof is narrowed by a second width 2×Y. The second width is wider than the first width, for example, twice as wide as the first width.

In the region 101, the width Z of the target wiring 110 is unchanged, in the region 102, the width Z of the target wiring 110 is narrowed by Y, and in the region 103, the width Z of the target wiring 110 is narrowed by 2×Y. With the area of the target wiring 110 after this process as B1, the aforementioned antenna ratio is calculated. When the antenna ratio exceeds a predetermined value, an antenna damage error is outputted.

In this embodiment, the antenna ratio is calculated according to the space between the target wiring and the adjacent wiring. For example, when a corrected area according to the space between the target wiring and the adjacent wiring and the area of the target wiring is taken as A1, the area of the protective element (diode) 822 connected to the target wiring 807 is taken as A2, and the area of the gate 805 is taken as A3, the antenna ratio is calculated by (A1−A2)/A3. The corrected area A1 corresponds to the area of the target wiring 110 in FIG. 3.

The antenna ratios when the spaces between the target wiring 110 and the adjacent wirings 112 and 113 are less than the predetermined value X as in the regions 102 and 103 are smaller than the antenna ratio when the space between the target wiring 110 and the adjacent wiring 111 is equal to or more than the predetermined value X as in the region 101. Moreover, the antenna ratio when the spaces between the target wiring 110 and the adjacent wirings 113 on both sides thereof are both less than the predetermined value X as in the region 103 is smaller than the antenna ratio when only the space between the target wiring 110 and the adjacent wiring 112 on one side thereof is less than the predetermined value X as in the region 102.

Figure 4:
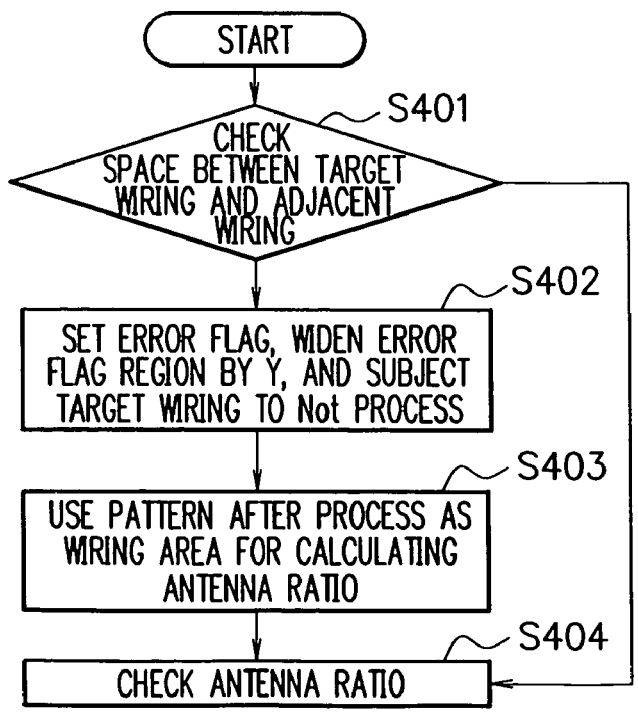
FIG. 4 is a flowchart showing a processing method of antenna damage verification according to the first embodiment.

FIG. 4 is a flowchart showing a processing method of the aforementioned antenna damage verification according to this embodiment. In step S401, a space between the target wiring and the adjacent wiring is checked. When the space is less than the threshold value X, the process goes to step S402, and when the space is equal to or more than the threshold value X, the width of the target wiring is unchanged and the process goes to step S404.

In step S402, an error flag of a region between the target wiring and the adjacent wiring is set. Then, the error flag region is extended outward by the predetermined value Y. Thereafter, the NOT process is performed so that a region of the target wiring overlapping with the error flag region is eliminated from the target wiring.

Subsequently, in step S403, the area of the target wiring of a layout pattern after the aforementioned process is taken as the wiring area A1 for calculating the antenna ratio.

Then, in step S404, the aforementioned antenna ratio is calculated based on the wiring area A1. When the antenna ratio exceeds the predetermined value, the antenna damage error is outputted (displayed). When the antenna damage error is outputted, the occurrence of antenna damage is anticipated, whereby the layout design is changed.

Second Embodiment

Figure 5:
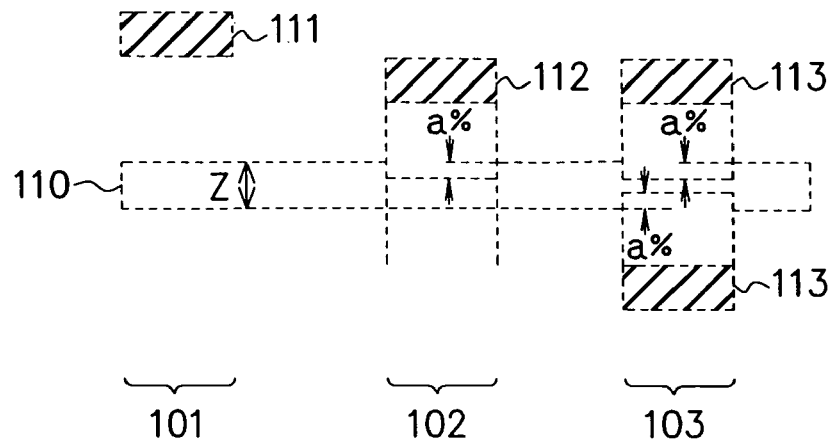
FIG. 5 is a diagram for explaining an antenna damage verification method according to a second embodiment of the present invention.

FIG. 5 is a diagram for explaining an antenna damage verification method according to the second embodiment of the present invention. This embodiment will be explained with a case where antenna damage verification is performed based on the layout data in FIG. 1 as an example.

When the space X1 between the target wiring and its adjacent wiring 111 is equal to or more than the predetermined value X in the region 101, the width Z of the target wiring 110 is unchanged. When only the space X2 between the target wiring 110 and the adjacent wiring 112 on one side thereof is less than the predetermined value X in the region 102, the wiring width Z of a portion of the target wiring 110 facing the adjacent wiring 112 is narrowed by a first rate of a %. When the spaces X3 between the target wiring 110 and the adjacent wirings 113 on both sides thereof are both less than the predetermined value X, the wiring width Z of a portion of the target wiring 110 facing the adjacent wirings 113 on both sides is narrowed by a second rate of (2×a) %. The second rate is larger than the first rate, for example, twice as large as the first rate.

In the region 101, the width Z of the target wiring 110 is unchanged, in the region 102, the width Z of the target wiring 110 is narrowed by a %, and in the region 103, the width Z of the target wiring 110 is narrowed by (2×a) %. With the area of the target wiring 110 after this process as the corrected area A1, the aforementioned antenna ratio is calculated. When the antenna ratio exceeds a predetermined value, an antenna damage error is outputted.

Figure 6:
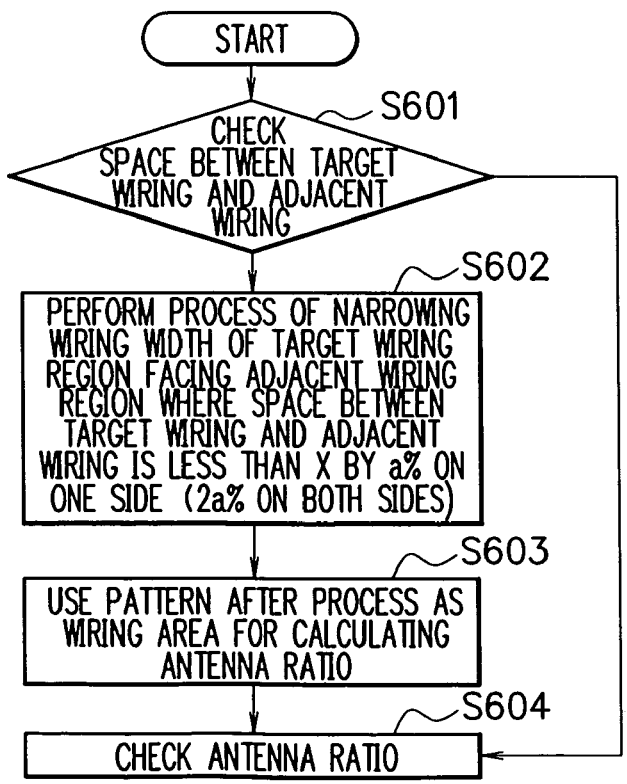
FIG. 6 is a flowchart showing a processing method of antenna damage verification according to the second embodiment.

FIG. 6 is a flowchart showing a processing method of the aforementioned antenna damage verification according to this embodiment. In step S601, a space between the target wiring and the adjacent wiring is checked. When the space is less than the threshold value X, the process goes to step S602, and when the space is equal to or more than the threshold value X, the width of the target wiring is unchanged and the process goes to step S604.

In step S602, when only the space between the target wiring and the adjacent wiring on one side thereof is less than X, a process of narrowing the wiring width of a region of the target wiring facing the adjacent wiring by a % is performed. Moreover, when the spaces between the target wiring and the adjacent wirings on both sides thereof are less than X, a process of narrowing the wiring width of a region of the target wiring facing these adjacent wirings by (2×a) % is performed.

Subsequently, in step S603, the area of the target wiring of the layout pattern after the aforementioned process is taken as the wiring area A1 for calculating the antenna ratio.

Then, in step S604, the aforementioned antenna ratio is calculated based on the wiring area A1. When the antenna ratio exceeds the predetermined value, the antenna damage error is outputted (displayed). When the antenna damage error is outputted, the occurrence of antenna damage is anticipated, whereby the layout design is changed.

Third Embodiment

Figure 7:
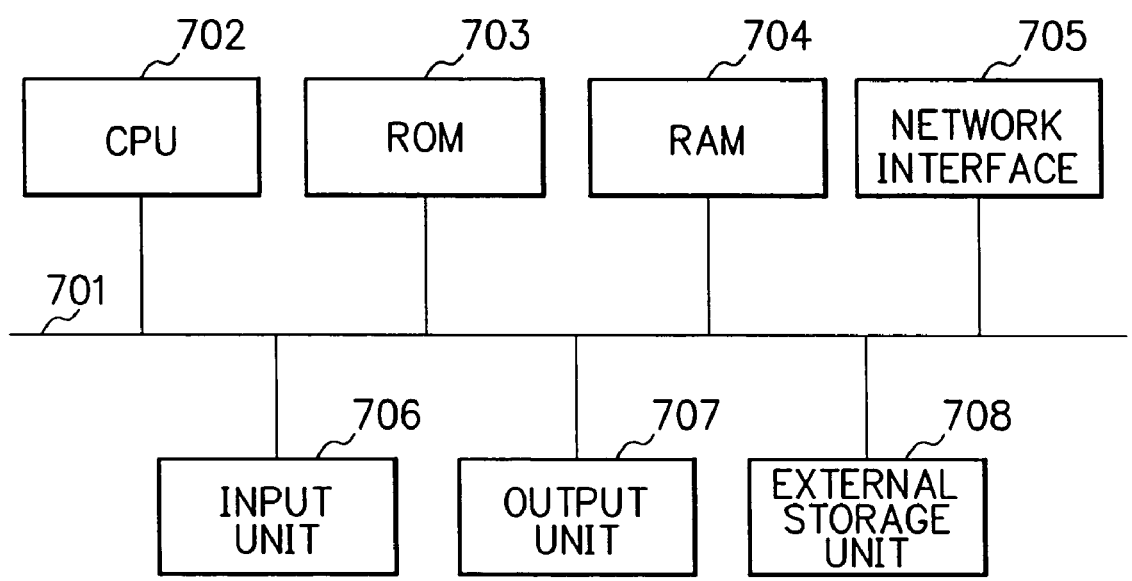
FIG. 7 is a block diagram showing a hardware configuration example of a computer which performs layout verification including antenna damage verification.

FIG. 7 is a block diagram showing a hardware configuration example of a computer for performing layout verification including the aforementioned antenna damage verification. This computer can create layout data on the semiconductor device by CAD (computer-aided design). A central processing unit (CPU) 702, a ROM 703, a RAM 704, a network interface 705, an input unit 706, an output unit 707, and an external storage unit 708 are connected to a bus 701.

The CPU 702 performs data processing and operation and controls the aforementioned component units connected via the bus 701. A boot program is previously stored in the ROM 703, and by the execution of this boot program by the CPU 702, the computer is booted up. A computer program is stored in the external storage unit 708, and this computer program is copied to the RAM 704 and executed by the CPU 702. This computer performs the process of antenna damage verification in FIG. 4 or FIG. 6 and the like by executing the computer program.

The external storage unit 708 is, for example, a hard disk storage unit or the like, and storage contents are not erased even if the power is turned off. The external storage unit 708 can record the computer program, the layout data, and the like on a recording medium and read the computer program and the like from the recording medium.

The network interface 705 can input/output the computer program, the layout data, and the like to/from a network. The input unit 706 is, for example, a keyboard, a pointing device (mouse), or the like, and can perform various kinds of designations, inputs, and so on. The output unit 707 is a display, a printer, or the like and can display or print the antenna damage error and the like.

This embodiment can be realized by making the computer execute a program. Moreover, means for supplying the program to the computer, for example, a computer-readable recording medium such as a CD-ROM on which the program is recorded or a transmission medium such as the Internet for transmitting the program is also applicable as an embodiment of the present invention. Further, a computer program product such as the aforementioned computer-readable recording medium on which the program is recorded is also applicable as an embodiment of the present invention. The aforementioned program, recording medium, transmission medium, and computer program product are included in the scope of the present invention. As the recording medium, for example, a flexible disk, a hard disk, an optical disk, a magneto-optic disk, a CD-ROM, a magnetic tape, a nonvolatile memory card, a ROM, and so on can be used.

As described above, according to the first to third embodiments, first, with the wiring connected to the gate through the via as the target wiring, the space between this target wiring and the wiring adjacent thereto is obtained. Then, the antenna ratio is calculated according to the space between the target wiring and the adjacent wiring, the area of the gate, and the area of the target wiring. When the antenna ratio exceeds a predetermined value, an antenna damage error is outputted.

When the space between the target wiring and the adjacent wiring is narrow, charge due to plasma etching flows from the target wiring into the adjacent wiring, thereby the amount of charge in the target wiring reduces, and consequently a tendency for the antenna damage to occur is reduced, whereby the antenna ratio can be made smaller. By calculating the antenna ratio according to the space between the target wiring and the adjacent wiring, the appropriate antenna ratio can be obtained. As a result, layout verification to prevent antenna damage can be effectively performed, so that the area of the protective element connected to the target wiring need not be made larger than necessary. Accordingly, an efficient layout can be realized, and the semiconductor device (semiconductor chip) can be downsized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A layout verification method, comprising:
   a space acquisition step of, with a wiring connected to a gate through a via as a target wiring, acquiring a space between the target wiring and an adjacent wiring;
   a calculation step of calculating an antenna ratio according to the space, an area of the gate, and an area of the target wiring; and
   an output step of outputting an antenna damage error when the antenna ratio exceeds a predetermined value.

2. The layout verification method according to claim 1, wherein the antenna ratio when the space between the target wiring and the adjacent wiring is less than a first predetermined value is smaller than the antenna ratio when the space between the target wiring and the adjacent wiring is equal to or more than the first predetermined value.

3. The layout verification method according to claim 1, wherein the antenna ratio when the spaces between the target wiring and the adjacent wirings on both sides thereof are both less than a first predetermined value is smaller than the antenna ratio when only the space between the target wiring and the adjacent wiring on one side thereof is less than the first predetermined value.

4. The layout verification method according to claim 1, wherein the antenna ratio when the space between the target wiring and the adjacent wiring is less than a first predetermined value is smaller than the antenna ratio when the space between the target wiring and the adjacent wiring is equal to or more than the first predetermined value, and the antenna ratio when the spaces between the target wiring and the adjacent wirings on both sides thereof are both less than the first predetermined value is smaller than the antenna ratio when only the space between the target wiring and the adjacent wiring on one side thereof is less than the first predetermined value.

5. The layout verification method according to claim 1, wherein the antenna ratio becomes larger as the area of the target wiring becomes larger, and becomes smaller as the area of the gate becomes larger.

6. The layout verification method according to claim 1, wherein the antenna ratio is determined according to the space, the area of the target wiring, an area of a protective element connected to the target wiring, and the area of the gate.

7. The layout verification method according to claim 6, wherein the protective element is a diode.

8. The layout verification method according to claim 6, wherein when a corrected area according to the space and the area of the target wiring is taken as A1, the area of the protective element connected to the target wiring is taken as A2, and the area of the gate is taken as A3, the antenna ratio is calculated by (A1−A2)/A3.

9. The layout verification method according to claim 8, wherein when the space between the target wiring and the adjacent wiring is less than a first predetermined value, a wiring width of a portion of the target wiring facing the adjacent wiring is narrowed by a second predetermined value to perform the calculation step with the area of the resulting target wiring as the corrected area A1, and the antenna ratio is calculated based on the corrected area A1.

10. The layout verification method according to claim 9, wherein when only the space between the target wiring and the adjacent wiring on one side thereof is less than the first predetermined value, a wiring width of a portion of the target wiring facing the adjacent wiring is narrowed by a first width, and when the spaces between the target wiring and the adjacent wirings on both sides thereof are both less than the first predetermined value, a wiring width of a portion of the target wiring facing the adjacent wirings on both sides is narrowed by a second width which is wider than the first width to perform the calculation step with the area of the resulting target wiring as the corrected area A1, and the antenna ratio is calculated based on the corrected area A1.

11. The layout verification method according to claim 10, wherein the second width is twice as wide as the first width.

12. The layout verification method according to claim 8, wherein when the space between the target wiring and the adjacent wiring is less than a first predetermined value, a wiring width of a portion of the target wiring facing the adjacent wiring is narrowed by a predetermined rate to perform the calculation step with the area of the resulting target wiring as the corrected area A1, and the antenna ratio is calculated based on the corrected area A1.

13. The layout verification method according to claim 12, wherein when only the space between the target wiring and the adjacent wiring on one side thereof is less than the first predetermined value, a wiring width of a portion of the target wiring facing the adjacent wiring is narrowed by a first rate, and when the spaces between the target wiring and the adjacent wirings on both sides thereof are both less than the first predetermined value, a wiring width of a portion of the target wiring facing the adjacent wirings on both sides is narrowed by a second rate which is larger than the first rate to perform the calculation step with the area of the resulting target wiring as the corrected area A1, and the antenna ratio is calculated based on the corrected area A1.

14. The layout verification method according to claim 13, wherein the second rate is twice as large as the first rate.

15. A layout verification device, comprising:
a space acquisition unit, with a wiring connected to a gate through a via as a target wiring, acquiring a space between the target wiring and a wiring adjacent thereto;
a calculation unit calculating an antenna ratio according to the space, an area of the gate, and an area of the target wiring; and
an output unit outputting an antenna damage error when the antenna ratio exceeds a predetermined value.

* * * * *